(12) United States Patent
Moindron et al.

(10) Patent No.: US 9,293,939 B2
(45) Date of Patent: Mar. 22, 2016

(54) CALIBRATION OF A BST CAPACITOR CONTROL CIRCUIT

(71) Applicant: STMicroelectronics (Tours) SAS, Tours (FR)

(72) Inventors: Laurent Moindron, Vernou sur Brenne (FR); Sylvain Charley, Mettray (FR); Jérôme Heurtier, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 14/602,015

(22) Filed: Jan. 21, 2015

(65) Prior Publication Data

US 2015/0207356 A1 Jul. 23, 2015

(30) Foreign Application Priority Data

Jan. 23, 2014 (FR) ..................... 14 50566

(51) Int. Cl.
  *G11C 5/14* (2006.01)
  *H02J 7/00* (2006.01)
  *H02J 7/34* (2006.01)

(52) U.S. Cl.
  CPC ............. *H02J 7/0072* (2013.01); *H02J 7/0052* (2013.01); *H02J 7/345* (2013.01)

(58) Field of Classification Search
  CPC ............. H02J 7/00; G01R 27/00; H02H 1/00
  USPC .............. 327/530; 320/166; 702/65; 361/113
  See application file for complete search history.

(56) References Cited

U.S. PATENT DOCUMENTS

| | | | |
|---|---|---|---|
| 6,225,861 B1 | 5/2001 | Kawai | |
| 6,674,321 B1 | 1/2004 | York | |
| 7,714,676 B2 * | 5/2010 | McKinzie, III | H03H 11/30 333/17.3 |
| 8,508,319 B1 * | 8/2013 | Newsham | H01P 1/30 333/231 |
| 2002/0180512 A1 * | 12/2002 | Papathanasiou | G05F 3/262 327/530 |
| 2004/0106014 A1 * | 6/2004 | Moon | H01G 7/06 428/697 |
| 2004/0207486 A1 * | 10/2004 | York | H03H 7/0153 333/171 |
| 2005/0259186 A1 * | 11/2005 | Mehr | H03G 3/3052 348/731 |
| 2006/0072276 A1 * | 4/2006 | Ruitenburg | H03J 1/0041 361/113 |
| 2007/0210879 A1 * | 9/2007 | Cardona | H03H 9/172 333/188 |
| 2008/0122712 A1 * | 5/2008 | Chen | H01Q 9/30 343/745 |
| 2008/0191794 A1 * | 8/2008 | Chiu | H03H 11/1291 327/553 |
| 2008/0191795 A1 * | 8/2008 | Dharmalingam | H03H 11/1291 327/553 |
| 2008/0204967 A1 * | 8/2008 | Du Toit | H01G 7/06 361/277 |
| 2008/0294359 A1 * | 11/2008 | Wissman | H04B 3/46 702/65 |
| 2009/0153431 A1 * | 6/2009 | Ni | H04B 1/18 343/861 |

(Continued)

FOREIGN PATENT DOCUMENTS

| | | |
|---|---|---|
| WO | 2007/121407 A1 | 10/2007 |
| WO | 2012/158693 A1 | 11/2012 |

*Primary Examiner* — Caleb Henry
(74) *Attorney, Agent, or Firm* — Seed IP Law Group PLLC

(57) ABSTRACT

A circuit for controlling a capacitor having a capacitance settable by biasing, including at least one terminal for receiving a digital set point value depending on the value desired for the capacitance, a circuit for determining a drift of the capacitance with respect to a nominal value, and a circuit of application of a correction to said digital set point value, depending on the determined drift.

16 Claims, 3 Drawing Sheets

(56) References Cited

U.S. PATENT DOCUMENTS

| | | | |
|---|---|---|---|
| 2009/0284220 A1* | 11/2009 | Toncich | G06K 7/0008 320/108 |
| 2011/0053524 A1 | 3/2011 | Manssen et al. | |
| 2013/0038292 A1* | 2/2013 | Barrett | G01R 31/3651 320/134 |
| 2013/0200962 A1* | 8/2013 | Serrano | H01P 7/082 333/205 |
| 2015/0162891 A1* | 6/2015 | Lee | G01R 31/2822 333/17.3 |
| 2015/0243437 A1* | 8/2015 | Charley | H01G 2/00 307/109 |

* cited by examiner

US 9,293,939 B2

CALIBRATION OF A BST CAPACITOR CONTROL CIRCUIT

CROSS-REFERENCE(S) TO RELATED APPLICATION(S)

This application claims the priority benefit of French Patent application number 14/50566, filed on Jan. 23, 2014, the contents of which are hereby incorporated by reference in their entirety to the maximum extent allowable by law.

BACKGROUND

1. Technical Field

The present disclosure generally relates to electronic circuits and, more specifically, to the control of capacitors having a value settable by application of a bias voltage. The present disclosure more specifically applies to the control of BST (Barium-Strontium-Titanium) capacitors.

2. Description of the Related Art

BST capacitors have essentially been developed for radio applications, in particular for mobile telephony. Having a capacitor with an analogically-adjustable capacitance significantly improves the performance, since it enables to adapt the device comprising such a capacitor to the outer environment.

A BST capacitor appears in the form of an integrated circuit (this type of capacitor is also called adjustable integrated capacitor). The capacitance of a BST capacitor is set by the value of a D.C. bias potential which is applied thereto, generally in a range from a few volts to a few tens of volts, typically between 2 and 20 volts.

The bias voltage of a BST capacitor is generally provided by a dedicated control circuit, performing a high-voltage digital-to-analog conversion, that is, converting a digital configuration word (generally, a byte) into a D.C. analog voltage to be applied to the capacitor to set its capacitance.

The control of a BST capacitor now suffers from inaccuracies due, among others, to manufacturing tolerances and temperature-related variations.

BRIEF SUMMARY

An embodiment of the present disclosure provides a calibration of a control circuit for an adjustable capacitor which overcomes all or part of the disadvantages of usual output circuits.

Another embodiment compensates for possible manufacturing tolerances and variations due to the operating temperature.

Another embodiment provides a solution compatible with usual BST capacitors and requiring no modification of the digital set point values provided by the application.

Thus, an embodiment provides a circuit for controlling a capacitor having a capacitance settable by biasing, including:
at least one terminal for receiving a digital set point value depending on the value desired for the capacitance;
a circuit for determining a drift of the capacitance with respect to a nominal value; and
a circuit for applying a correction to said digital set point value, depending on the determined drift.

According to an embodiment, the circuit includes:
a digital-to-analog converter receiving said corrected set point value; and
an amplifier for generating a signal for biasing said capacitor.

According to an embodiment, a switch connects an output terminal intended to deliver said bias signal, either to said determination circuit, or to the output of said amplifier.

According to an embodiment, said determination circuit determines a duration for the capacitor to reach a charge threshold.

According to an embodiment, said determination circuit causes a progressive charge of said capacitor.

According to an embodiment, the control circuit comprises a reference capacitor connection terminal.

According to an embodiment, the correction is a percentage applied to the digital set point value.

An embodiment also provides a system including:
at least one capacitor having a settable capacitance; and
at least one control circuit.

The foregoing and other features and advantages will be discussed in detail in the following non-limiting description of specific embodiments in connection with the accompanying drawings.

DETAILED DESCRIPTION

Figure 1:
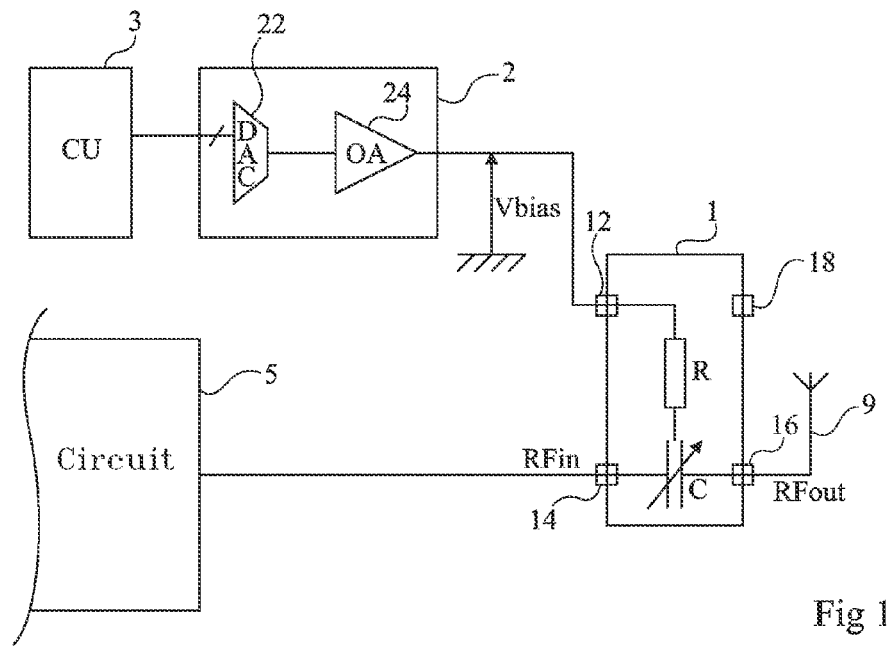
FIG. 1 is a simplified representation of an electronic architecture using a BST capacitor.

The same elements have been designated with the same reference numerals in the different drawings. For clarity, only those steps and elements which are useful to the understanding of the embodiments which will be described have been shown and will be detailed. In particular, the forming of a BST capacitor as well as of the other portions of the control circuit have not been detailed, the described embodiments being compatible with usual applications of capacitors settable by application of a bias voltage (for example, BST capacitors) and of the rest of the control circuit. Further, the different possible applications of a BST capacitor have not been detailed either, the described embodiments being here again compatible with usual applications. In the following description, expressions "approximately," "about," and "in the order of" mean to within 10%.

FIG. 1 is a simplified representation of an example of integrated electronic circuit 1 forming a BST capacitor, or more generally a capacitor having a capacitance settable by biasing, in an application environment.

Capacitor 1 generally comprises at least three terminals 12, 14, and 16. In practice, for industrial manufacturing reasons, the integrated circuit package may comprise other terminals 18 which are not intended to be connected. Terminals 14 and 16 define terminals corresponding to the electrodes of capacitor C intended to be connected to the radio frequency application. Further, one of terminals 14 and 16 is grounded. According to the application, such a connection is either direct, or (case of a capacitor used in series in the radio frequency chain) achieved via an inductive element. Terminal 12 defines a terminal of application of a bias voltage Vbias setting the value of the capacitance of capacitor C. From an electrical point of view, this bias potential is applied via a resistor R.

Bias voltage Vbias is delivered by a control circuit 2 formed of a high-voltage digital-to-analog converter 22 containing a correlation table between a digital instruction word provided by a processor 3 (CU) of the application and a corresponding potential to be applied to terminal 12 to reach the value desired for the capacitance. Control circuit 2 receives a low-voltage digital signal (in the order of a few volts, or even less) from processor 3 and converts it into an analog signal Vbias of high voltage (with respect to the low voltage of the digital portion) capable of reaching a few tens of volts. Circuit 2 is schematized in FIG. 1 as a digital-to-analog converter 22 (DAC) receiving the digital set point value from the processor, followed by an amplifier 24 (OA) delivering voltage Vbias to terminal 12 of capacitor 1.

An example of control circuit 2 is known under trade name "PTIC Controller", for example, under reference STHV-DAC-253M.

In the example of FIG. 1, it can be considered that terminal 14 of capacitor 1 forms an input terminal RFin for a radio signal while terminal 16 forms an output terminal RFout for this signal. However, a capacitor 1 is symmetrical and the connection of its terminals depends on the application. Capacitor 1 is assumed to take part in the tuning of an antenna 9 intended to receive radio signals from a circuit 5 which has not been detailed.

Multiple applications use capacitors settable by continuous biasing, among which, as an example, adjustable antenna matching networks in multiband mobile telephony systems, tunable radio filters, frequency band adjustment circuits, voltage standing wave ratio (VSWR) correction circuits, etc.

A problem which is posed with the use of BST capacitors is due to capacitor and control circuit manufacturing tolerances, as well as to capacitance variations in relation with the operating temperature. All these cumulated factors may result in variations by more than 20% of the capacitance value with respect to the desired value.

It could be envisaged to measure the radio signal at the output of the BST capacitor (between capacitor 1 and antenna 9 in the example of FIG. 1) and to provide this measurement to processor 3 so that it controls the digital word that it delivers. Such a control loop should provide an acceptable result. However, this solution operates by inserting a radio measurement element in the transmission chain and risks generating other disturbances. This would further result in a particularly expensive solution. Further, this takes intervening on the actual application, that is, on the transmission chain, downstream of capacitor 1, and upstream on processor 3.

It is thus preferred to provide a solution which uses no measurement in the transmission chain and which uses no modification at the application level, in particular at the level of processor 3.

Figure 2:
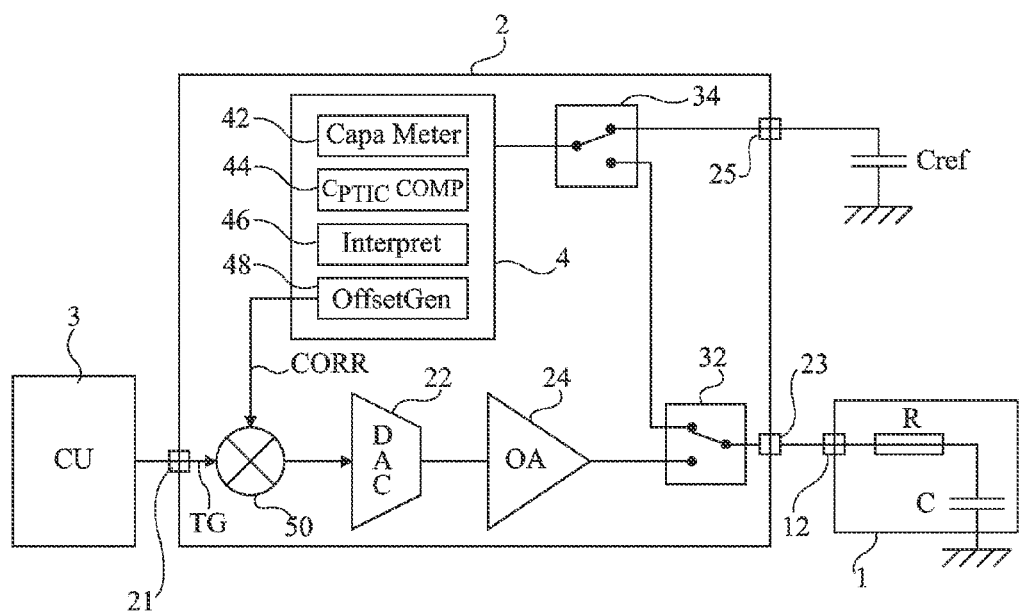
FIG. 2 is a functional block diagram of an embodiment of BST capacitor control circuit.

FIG. 2 schematically and functionally shows an embodiment of a circuit 2 for controlling a BST capacitor 1. Although, for simplification, circuit 2 is assumed to only control a BST capacitor, circuit 2 may comprise a plurality of outputs to independently control a plurality of BST capacitors. Only the biasing portion of capacitor 1 has been shown, since the rest (the radio portion) is not modified by the implementation of the described solution.

Circuit 2 receives, from processor 3, a digital set point signal (in series or parallel form) on one or a plurality of input terminals 21. Circuit 2 generates, on a terminal 23, signal Vbias for biasing capacitor 1. In FIG. 2, capacitor 1 is symbolized in the form of its equivalent electric diagram, that is, a series RC circuit between terminal 12 of application of voltage Vbias and ground.

Circuit 2 comprises two operating modes. In a first mode, or calibration phase, the capacitance value or, more specifically, the drift of this value with respect to its nominal value, is assessed. An offset (in percentage) to be applied to the different biasings of the capacitor can then be deduced. In a second mode, or operational phase, circuit 2 applies to the digital set point received from processor 3 the offset deduced from the calibration phase, to generate a voltage Vbias which enables to approach the desired capacitance value.

Advantage is here taken from the fact that, in case of a drift with respect to a nominal value, this drift is essentially a relative drift and not an absolute drift. Thus, the determination of a percentage with respect to a nominal or known value is sufficient.

Figure 3:
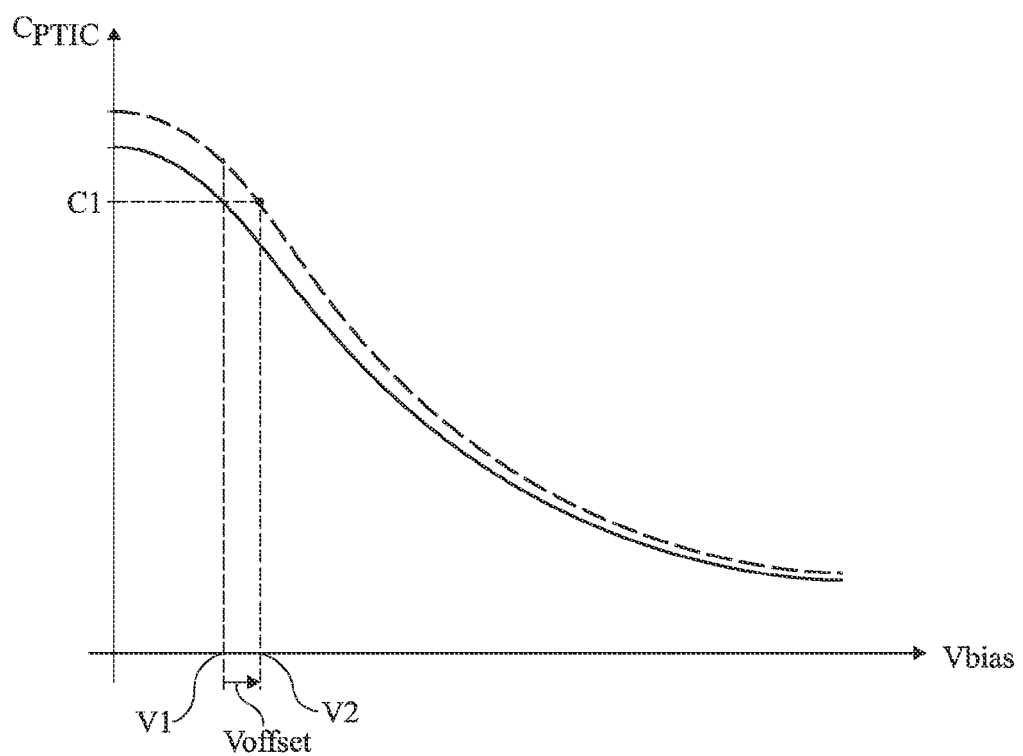
FIG. 3 is a graph illustrating the operation of an embodiment of the control circuit of FIG. 2.

FIG. 3 is a graph illustrating the variation of the value of capacitance $C_{PTIC}$ according to bias voltage Vbias. The curve in full line illustrates the nominal shape of capacitance $C_{PTIC}$. The curve in dotted line illustrates an example of the current shape of this same capacitance.

According to an embodiment, processor 3 delivers a digital word TG representing a value V1 of bias voltage Vbias for which the expected capacitance $C_{PTIC}$ (on the nominal curve) has a value C1. By applying an offset percentage to this value (the percentage determined in the calibration phase), this results in a value V2 for which value C1 is reached by the curve in dotted line.

According to another embodiment, digital word TG delivered by processor 3 represents value C1 desired for capacitance $C_{PTIC}$. Circuit 2 reads value TG, deduces value V1 therefrom, and then applies the correction to deliver V2 of bias voltage Vbias for which the expected capacitance $C_{PTIC}$ (on the nominal curve) has a value C1. By applying an offset percentage to this value, this results in a value V2 for which value C1 is reached by the curve in dotted line.

According to the embodiment shown in FIG. 2, a reference capacitor Cref is also used. Reference capacitor means a specific capacitor, that is, having relatively small technological dispersions (typically in the order of one percent) as compared with capacitor 1. The reference capacitor is not indispensable and its inclusion depends on the method used to assess the current value of capacitance $C_{PTIC}$ and on the accuracy of circuits internal to control circuit 2, as will be seen hereafter in relation with FIG. 4.

In the presence of a capacitor Cref connected to a terminal 25 of circuit 2, a switch 34 is interposed between the second output of switch 32 and a circuit 4. In a first position, switch 34 connects switch 32 to circuit 4. In a second position, switch 34 connects circuit 4 to terminal 25 (and thus to capacitor Cref).

Functionally, circuit 4 achieves:
 a measurement (block 42, Capa Meter) of a current value of the capacitance ($C_{PTIC}$ or Cref) of the capacitor to which it is connected;
 a comparison (block 44, $C_{PTIC}$ COMP) of the measured current value of capacitance $C_{PTIC}$ of capacitor 1 with an expected nominal value (possibly deduced from the measurement of value Cref);
 an interpretation (block 46, Interpret) of the measurements to determine an offset (percentage) to be applied to set point value TG received from processor 3; and
 a generation (block 48, OffsetGen) of a digital signal CORR for correcting digital word TG provided by processor 3.

The size of digital word CORR, for example, one byte, is preferably the same as that of word TG provided by processor 3. Word CORR is added (digital adder 50) to signal TG to provide the corrected set point to digital-to-analog converter 22. In practice, circuit 2 reads value TG to calculate the digital word representing the absolute offset according to the percentage determined in the calibration phase. As a variation, the adder performs this function and signal CORR represents the percentage.

Figure 4:
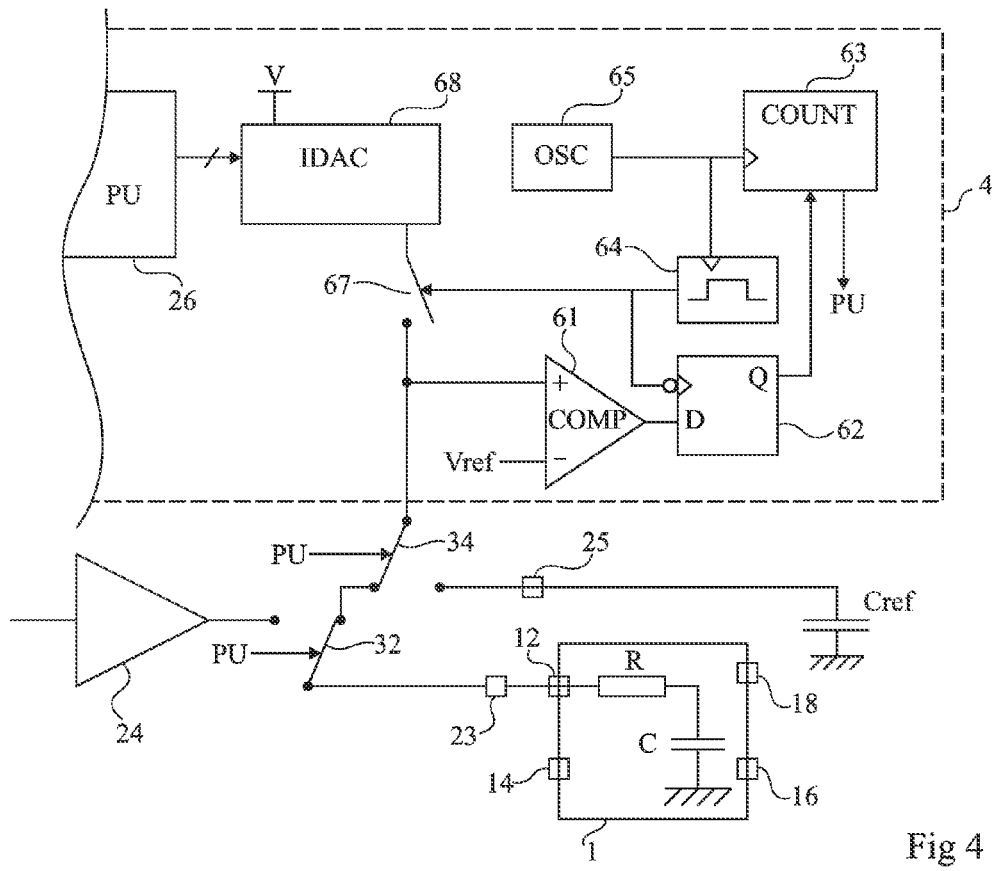
FIG. 4 is a block diagram of an embodiment of BST capacitor calibration circuit.

FIG. 4 is a block diagram schematically showing a partial embodiment of a circuit 4 to determine, in a calibration phase, the correction percentage to be then applied to the set point delivered by processor 3. In practice, circuit 4 comprises a plurality of analog and digital circuits to carry out the different measurement and interpretation functions. In FIG. 4, the function of measurement of the current value of capacitance $C_{PTIC}$ is mainly considered.

Figure 5:
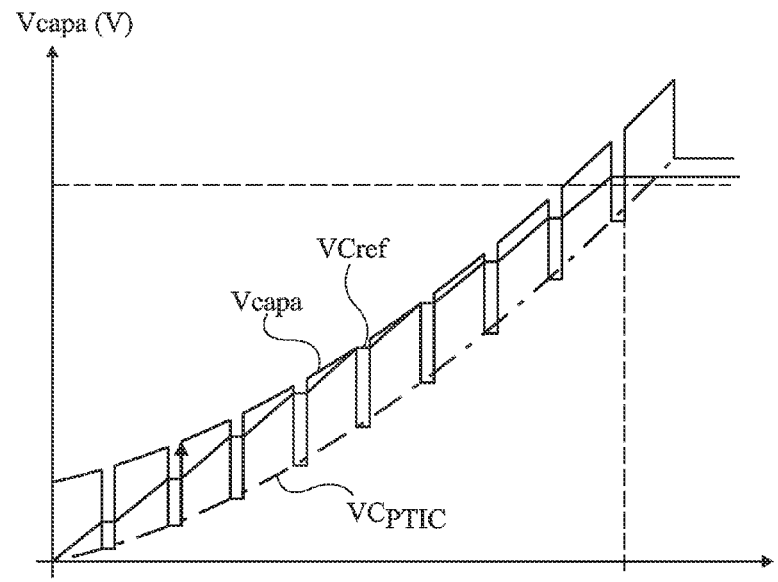
FIG. 5 is a graph illustrating the operation of the circuit of FIG. 4.

FIG. 5 is a graph illustrating the operation of the circuit of FIG. 4. This graph is a timing diagram showing an example of variation of the voltages measured across capacitances Cref and $C_{PTIC}$ to deduce the drift percentage.

To assess the current value of capacitance $C_{PTIC}$, switches 32 and 34, controlled by a processing unit 26 of circuit 4, connect terminal 23 to a first input, for example, non-inverted (+) of a comparator 61 having a second input receiving a reference voltage Vref, defining a threshold, as will be seen hereafter. The comparator output is connected to the D input of a D flip-flop 62 having its output Q providing a signal intended for a counter 63 (COUNT). The flip-flop is synchronized by a signal provided by a delay element 64 generating, from an oscillator 65 (OSC), pulses having a determined duration. Oscillator 65 further delivers a clock signal to counter 63. Element 64 controls a switch 67 for connecting a controlled current source 68 to the non-inverted input of comparator 61, and thus (with the positions of switches 32 and 34), to terminal 23. Current source 68 is, for example, a digital-to-analog converter (IDAC) based on switchable current sources, enabling to apply a current Iref to capacitor Cref and a current equal to Iref($C_{PTIC}$/Cref) to capacitor 1.

Calibration circuit 4 (or the circuit for determining the correction percentage to be applied to the set point provided by processor 3) operates as follows. This operation is illustrated in FIG. 5.

A progressive charge of capacitor 1 is caused by means of current source 68 (switch 67 on) during pulses having their duration set by circuit 64. At the end of each pulse, switch 67 is turned off and voltage Vcapa is compared with voltage Vref. The taking into account of the result of the comparison by flip-flop 62 is triggered by the end of the pulse provided by circuit 64. As long as current value Vcapa is smaller than value Vref, counter 63 is incremented for each pulse. As soon as voltage Vcapa reaches value Vref, the counting is stopped and the result (number of periods which have been used to charge capacitor 1) is delivered to processing unit 26.

As illustrated in FIG. 5, at each end of a pulse, value Vcapa decreases all the way to a curve in dotted lines. Curve $VC_{PTIC}$ actually represents the current value of capacitance $C_{PTIC}$. This value is however not directly measurable due to biasing resistance R. The interval between the level of voltage Vcapa during pulses and outside of pulses corresponds to the voltage drop in resistor R.

Once the measurement has been performed, it is interpreted by comparison with a reference value, that is, with a value which depends on the nominal value of capacitance $C_{PTIC}$. This value may correspond to a number of periods.

The capacitor drift (in percentage) is thus assessed to apply the correction signal.

In the case where a reference capacitor Cref is used, a similar measurement is performed. Switch 34 then connects comparator 61 and switch 67 to terminal 25. FIG. 5 shows that voltage VCref does not drop between pulses. This is due to the fact that the voltage across capacitor Cref is directly measured.

The frequency of the calibration phases depends on the application and on the time available to perform them. For example, a calibration is performed at the beginning and at the end of each telephone communication, and periodically when the telephone is at stand-by to take into account slow temperature variations.

Various embodiments and variations have been described. Various alterations, modifications, and improvements will readily occur to those skilled in the art. In particular, the practical implementation of the described embodiments is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit configured to control a capacitor having a capacitance settable by a bias signal, comprising:
    at least one terminal configured to receive a digital set point value depending on a value selected for the capacitance;
    a determination circuit configured to determine a drift of the capacitance with respect to a nominal value; and
    an adder circuit configured to apply a correction to said digital set point value, depending on the determined drift.

2. The circuit of claim 1, comprising:
    a digital-to-analog converter configured to receive said corrected set point value; and
    an amplifier configured to generate the bias signal for said capacitor.

3. The circuit of claim 2 wherein a switch connects an output terminal configured to deliver said bias signal, either to said determination circuit, or to the output of said amplifier.

4. The circuit of claim 1 wherein said determination circuit determines a duration for the capacitor to reach a charge threshold.

5. The circuit of claim 4 wherein said determination circuit causes a progressive charge of said capacitor.

6. The circuit of claim 1, comprising a terminal of connection of a reference capacitor.

7. The circuit of claim 1 wherein the correction is a percentage applied to the digital set point value.

8. A system, comprising:
    a first capacitor having a settable capacitance, the capacitor having a first terminal; and a control circuit coupled to the first terminal, the control circuit including:
  a second terminal configured to receive a set point signal;
  a calibration circuit configured to output a correction signal;
  a combination circuit configured to receive the set point signal and the correction signal;
  a signal processing chain coupled to combination circuit and the first terminal of the first capacitor to provide a bias signal to set the capacitor in a calibration phase.

9. The system of claim 8 wherein the signal processing chain includes a digital-to-analog converter coupled to the combination circuit and an amplifier coupled to the digital-to-analog converter and a first switch coupled between the amplifier and the first terminal of the first capacitor.

10. The system of claim 9 wherein the control circuit includes a second switch coupled between the first switch, the calibration circuit, and a third terminal.

11. The system of claim 10, further comprising a second capacitor that is coupled to the third terminal, the second capacitor being a reference capacitor.

12. The system of claim 8 wherein the calibration circuit includes:
  a processing unit;
  a current source coupled to the processing unit;
  a third switch configured to be controlled by the current source;
  an oscillator;
  a counter coupled to the oscillator and the processing unit;
  a delay circuit coupled to the oscillator;
  a flip flop coupled to the delay circuit and the counter; and
  a comparator having an output coupled to the flip flop, the comparator configured to receive a signal from the third switch and from the second switch at a first input, the comparator also configured to receive a reference voltage at a second input.

13. A device, comprising:
a control circuit having a calibration phase and an operating phase, the control circuit including:
  a first terminal configured to output a bias signal to a capacitor in the calibration phase;
  a second terminal configured to receive a set point signal;
  a calibration circuit configured to output a correction signal;
  a combination circuit configured to receive the set point signal and the correction signal;
  a signal processing chain coupled to combination circuit and the first terminal to provide the bias signal in the calibration phase.

14. The device of claim 13 wherein the signal processing chain includes a digital-to-analog converter coupled to the combination circuit and an amplifier coupled to the digital-to-analog converter and a first switch coupled between the amplifier and the first terminal.

15. The device of claim 14 wherein the control circuit includes a second switch coupled between the first switch, the calibration circuit, and a third terminal.

16. The system of claim 13 wherein the calibration circuit includes:
  a processing unit;
  a current source coupled to the processing unit;
  a third switch configured to be controlled by the current source;
  an oscillator;
  a counter coupled to the oscillator and the processing unit;
  a delay circuit coupled to the oscillator;
  a flip flop coupled to the delay circuit and the counter; and
  a comparator having an output coupled to the flip flop, the comparator configured to receive a signal from the third switch and from the second switch at a first input, the comparator also configured to receive a reference voltage at a second input.

\* \* \* \* \*